(12) United States Patent
Ohshima

(10) Patent No.: US 7,521,787 B2
(45) Date of Patent: Apr. 21, 2009

(54) SEMICONDUCTOR DEVICE

(75) Inventor: Yumiko Ohshima, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 346 days.

(21) Appl. No.: 11/433,424

(22) Filed: May 15, 2006

(65) Prior Publication Data

US 2006/0255472 A1    Nov. 16, 2006

(30) Foreign Application Priority Data

May 16, 2005    (JP)    ............... P2005-142886

(51) Int. Cl.
H01L 23/02    (2006.01)
H01L 23/48    (2006.01)
(52) U.S. Cl. ............... 257/686; 257/778; 257/E25.013; 438/108
(58) Field of Classification Search ................ 257/686, 257/778, E25.013; 438/108
See application file for complete search history.

(56) References Cited

U.S. PATENT DOCUMENTS 6,369,443 B1    4/2002    Baba
6,518,666 B1    2/2003    Ikeda
2005/0077080 A1*  4/2005    Dairo et al. ............... 174/255
2006/0237832 A1* 10/2006   James et al. ............... 257/678

FOREIGN PATENT DOCUMENTS

JP    2001-35960    2/2001
JP    2001-156246   6/2001

OTHER PUBLICATIONS

Patent Abstract of TW525422, Family of JP 2001-035960 and U.S. Patent No. 6,369,443.

* cited by examiner

Primary Examiner—Tuan N. Quach
(74) Attorney, Agent, or Firm—Finnegan, Henderson, Farabow, Garrett & Dunner, L.L.P.

(57) ABSTRACT

Disclosed is a semiconductor device, including an organic material-based substrate; a semiconductor chip, flip-chip connected to substantially a center of one surface side of the organic material-based substrate; a resin disposed to fill a space between the semiconductor chip and the organic material-based substrate; a lid member fixed to an outer peripheral region of a region the semiconductor chip is positioned at, on the one surface side of the organic material-based substrate to which the semiconductor chip is flip-chip connected and also fixed to the semiconductor chip in a side opposite to a flip-chip connected side of the flip-chip connected semiconductor chip; and a substrate support member disposed to extend from a vicinity of a portion of the lid member, the portion being fixed to the organic material-based substrate, and to protrude beyond a thickness of the organic material-based substrate in a thickness direction of the organic material-based substrate.

7 Claims, 9 Drawing Sheets

SEMICONDUCTOR DEVICE

CROSS-REFERENCE TO RELATED APPLICATIONS

This application is based upon and claims the benefit of priority from the prior Japanese Patent Application No. 2005-142886 filed on May 16, 2005; the entire contents of which are incorporated herein by reference.

BACKGROUND

1. Field of the Invention

The present invention relates to a semiconductor device having a semiconductor chip, and more particularly to a semiconductor device having a flip-chip connected semiconductor chip.

2. Description of the Related Art

With progress in complication of the structure and high performance of the semiconductor device (semiconductor package), a phenomenon that reliability of a connected portion lowers because of a warp of the package, a deformation in the solder ball-connected portion at the time of connection due to a weight of the package, or the like cannot be overlooked. The semiconductor devices having the flip-chip connected semiconductor chip include a type that an external connection terminal for connection to another wiring substrate is disposed on a surface opposite to the surface of the resin substrate to which the semiconductor chip is connected. The external connection terminal accompanies solder balls, and the semiconductor device is mounted and connected to another wiring substrate through the solder balls.

This type of semiconductor device has generally a large stress in the solder balls of the external connection terminal at the corner portions of the package or on just the back surface of the connection position of the semiconductor chip. The stress becomes large at the corner portions of the package because a distance from the center is large, and distortion (generally, distortion in vertical and lateral directions) becomes large accordingly. It is assumed that the stress becomes large just on the back of the semiconductor chip because a thermal expansion coefficient is largely different between the resin substrate and the semiconductor chip, only the deformation of the resin substrate of the package side is restricted to be small by the deformation of the semiconductor chip, another wiring substrate is not restricted, and the solder balls are positioned in a state held between these substrates. Thus, the phenomenon that the deformation of the resin substrate of the package side is restricted to be small by the deformation of the semiconductor chip is more conspicuous in the embodiment that a resin is filled in the space between the resin substrate and the semiconductor chip.

In a case, for example, where a large heat sink is integrally disposed with a package, a deformation of the solder ball connected portions at the time of connection tends to occur due to the weight of the package. The deformation of the solder balls due to the weight occurs to decrease the size in the vertical direction, so that the occurrence of the stress in a shear direction exerts large distortion per unit length accordingly and affects on the reliability. The structures of similar semiconductor devices are disclosed in the following Patent Documents 1 and 2 though the devices are not directly related to the contents of the present application.

[Patent Document 1] Japanese Patent Laid-Open Application No. 2001-35960 (FIG. 4)

[Patent Document 2] Japanese Patent Laid-Open Application No. 2001-156246 (FIG. 16)

SUMMARY

A semiconductor device according to an aspect of the present invention comprises an organic material-based substrate; a semiconductor chip being flip-chip connected on substantially a center of one surface side of the organic material-based substrate; a resin disposed to fill a space between the flip-chip connected semiconductor chip and the organic material-based substrate; a lid member fixed to an outer peripheral region of a region the semiconductor chip is positioned at, on the one surface side of the organic material-based substrate to which the semiconductor chip is flip-chip connected and also fixed to the semiconductor chip in a side opposite to a flip-chip connected side of the flip-chip connected semiconductor chip; and a substrate support member disposed to extend from a vicinity of a portion of the lid member fixed to the organic material-based substrate and to protrude beyond a thickness of the organic material-based substrate in a thickness direction thereof.

A semiconductor device according to another aspect of the present invention comprises an organic material-based substrate; a semiconductor chip being flip-chip connected to substantially a center of one surface side of the organic material-based substrate; a resin disposed to fill a space between the flip-chip connected semiconductor chip and the organic material-based substrate; a lid member fixed to an outer peripheral region of a region the semiconductor chip is positioned at, on the one surface side of the organic material-based substrate to which the semiconductor chip is flip-chip connected and also fixed to the semiconductor chip in a side opposite to a flip-chip connected side of the flip-chip connected semiconductor chip; and a substrate support member disposed to protrude from a surface opposite to the one surface side of the organic material-based substrate where the semiconductor chip is flip-chip connected.

A semiconductor device according to still another aspect of the present invention comprises an organic material-based substrate; a semiconductor chip being flip-chip connected to substantially a center of one surface side of the organic material-based substrate; a resin disposed to fill a space between the flip-chip connected semiconductor chip and the organic material-based substrate; and a chip member disposed on another surface side of the organic material-based substrate opposite to the flip-chip connected semiconductor chip with the organic material-based substrate between the chip member and the flip-chip connected semiconductor chip and having a substantially same main surface area as the semiconductor chip.

DETAILED DESCRIPTION

Description of the Embodiments

Figure 1A:
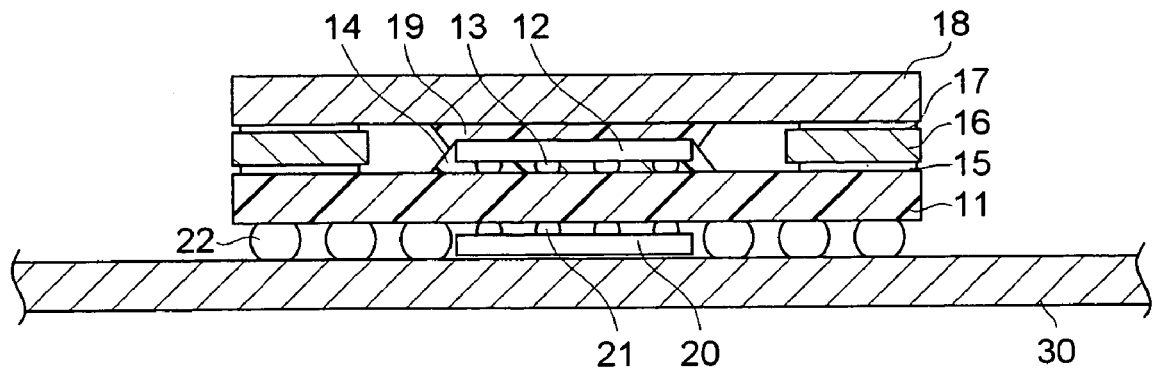
FIG. 1A and FIG. 1B are a sectional view and a bottom plan view schematically showing the structures of a semiconductor device according to an embodiment of the invention.

Embodiments of the present invention is described with reference to the drawings, which are provided for illustration only and do not limit the present invention in any respect.

According to a semiconductor device of one mode of the present invention, a substrate support member is disposed to extend from the vicinity of a portion of a lid member fixed to an organic material-based substrate and to protrude in the thickness direction of the organic material-based substrate so as to exceed its thickness. According to a semiconductor device of another mode of the present invention, a substrate support member is disposed to protrude from a surface opposite to the surface of the organic material-based substrate where the semiconductor chip is flip-chip connected. By these support members, a stand-off can be secured when the organic material-based substrate is connected to another substrate. Therefore, deformation of a connection member, for example, solder balls, in the vertical direction is decreased at the time of mounting, and the mounting reliability can be improved.

Here, as a form of an embodiment, a chip member, which is disposed on another surface of the organic material-based substrate opposite to the flip-chipped semiconductor chip with the organic material-based substrate intervened between them and has substantially the same main surface area as that of the semiconductor chip, may further be provided. By configuring in this way, a warp of the organic material-based substrate due to a largely different thermal expansion coefficient between the semiconductor chip and the organic material-based substrate is cancelled by the chip member which is disposed on the other surface. Thus, the warp of the organic material-based substrate is decreased, and a stress caused in a connected portion with the substrate on which the organic material-based substrate is mounted can be decreased effectively.

Here, as a form of an embodiment, it can be configured that an external connection terminal, which is disposed in an outer peripheral region of a region where the chip member is positioned on the surface of the organic material-based substrate, is further provided, and the external connection terminal involves solder balls. This is a case that the external connection terminal is a terminal as a BGA (ball grid array) package.

As a form of an embodiment, it can be configured that the chip member has a semiconductor substrate and plural capacitor elements which are integrated on the semiconductor substrate, and the plural capacitor elements are electrically connected to the organic material-based substrate, respectively. This is a form in that the chip member is particularly a capacitor element having the semiconductor substrate. Being the semiconductor substrate has an advantage that the material is the same as the semiconductor chip which is flip-chip connected on the opposite side with the organic material-based substrate between them. They have the same thermal expansion coefficient, and the deformation such as a warp of the organic material-based substrate can be decreased effectively. In addition, by having the capacitor element, a capacitor element can be provided as a bypass capacitor or the like which is originally required as a semiconductor package.

As a form of an embodiment, a second resin which is disposed to fill the space between the chip member and the organic material-based substrate may further be provided. The resin is disposed between the flip-chip connected semiconductor chip and the organic material-based substrate on the opposite side with the organic material-based substrate therebetween, so that the same structure is also provided on the opposite surface. Thus, the restriction of the deformation from both surfaces of the organic material-based substrate is balanced better, and the deformation of the organic material-based substrate is further decreased.

As a form of an embodiment, the organic material-based substrate may have a shape with cutoff portions or through holes for relief from the substrate support member. The disposition of the relief portions in the organic material-based substrate does not increase the size of the semiconductor device as a whole. It is useful for applications requiring good mounting area efficiency.

According to a semiconductor device of still another mode of the invention, a semiconductor chip and a chip member having substantially the same area are disposed on the opposite surfaces of an organic material-based substrate. By configuring in this way, a warp of the organic material-based substrate because of a largely different thermal expansion coefficient between the semiconductor chip and the organic material-based substrate is cancelled by the chip member disposed on the opposite surface. Therefore, the warp of the organic material-based substrate is decreased, and the generation of stress at a connected portion with the substrate on which the organic material-based substrate is mounted can be decreased effectively. Thus, the mounting reliability can be improved.

Here, as a form of an embodiment, a lid member, which is fixed to an outer peripheral region of a region the semiconductor chip is positioned at, on the surface of the organic material-based substrate where the semiconductor chip is flip-chip connected and also fixed to the semiconductor chip in a surface opposite to the flip-chip connected surface of the flip-chip connected semiconductor chip, may be further provided. A warp of the organic material-based substrate can be decreased by the lid member.

Here, substrate support member, which is extended from the vicinity of a portion of the lid member fixed to the organic material-based substrate and disposed to protrude so as to exceed the thickness of the organic material-based substrate in its thickness direction, can further be provided.

Figure 1B:
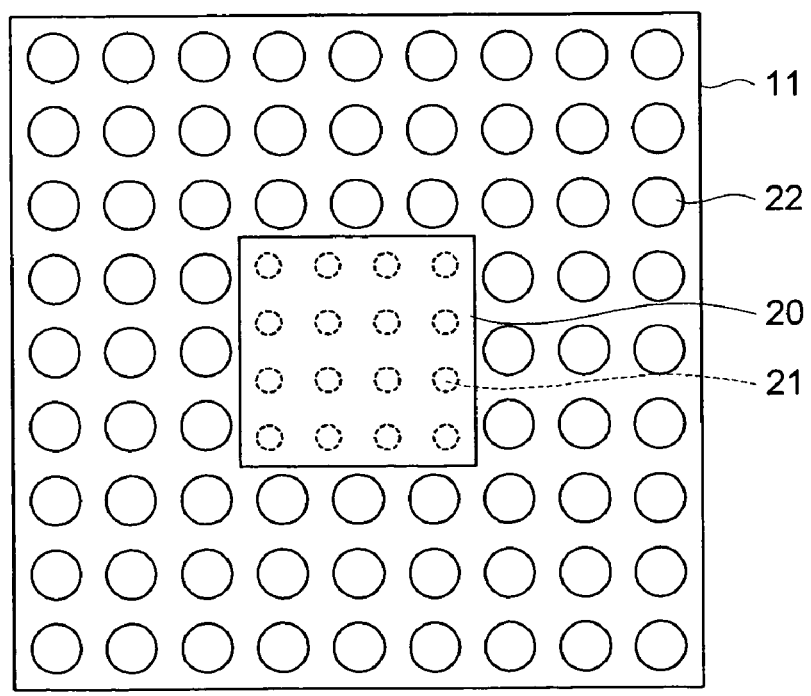

Under the circumstances described above, embodiments of the present invention will be described with reference to the drawings. FIG. 1A and FIG. 1B are a sectional view (FIG. 1A) and a bottom plan view (FIG. 1B) schematically showing the structures of the semiconductor device according to an embodiment of the invention. As shown in FIG. 1A and FIG. 1B, this semiconductor device has a resin substrate 11 as an organic material-based substrate, a semiconductor chip 12, connection bumps 13, an underfill resin 14, a resin 15, a stiffener 16, a resin 17, a cover plate 18, a resin 19, a chip member 20, connection bumps 21, and solder balls 22. FIG. 1A shows a mounted and connected state of the semiconductor device to a mounting wiring board (substrate) 30 through the solder balls 22. Because FIG. 1A and FIG. 1B are schematic views, the actual number of solder balls 22, connection bumps 13 and the like is considerably larger than that shown in the drawings. The same is also true on the individual embodiments described later.

The resin substrate 11 is a wiring board having an insulation plate which is formed of an organic material, for example, a glass epoxy resin. For example, it has six (or more) wiring layers (not shown), and its top layer includes a land (not shown), which is connected to the connection bumps 13, as a pattern, and the bottom layer includes a land (not shown), which is connected to the connection bumps 21 and the solder balls 22, as a pattern. The patterns of the individual wiring layers are electrically conducted in a longitudinal direction at required portions by a conductor in a vertical direction (not shown). As the resin substrate 11, its thickness is, for example, about 1 mm or more, and each side has a length of, for example, about 28 mm or more and about 50 mm or less.

The semiconductor chip 12 is flip-chip connected to about the center of one side of the resin substrate 11 through the connection bumps 13. In addition, the underfill resin 14 of, for example, thermosetting is filled into the space between the semiconductor chip 12 and the resin substrate 11 to improve the reliability.

The stiffener 16 is disposed to surround the semiconductor chip 12 through, for example, the thermosetting resin 15 on an outer peripheral region of a region, where the semiconductor chip 12 is positioned, on the resin substrate 11. This surrounding may be made to fully surround or partly surround. The stiffener 16 is a member for reinforcing the semiconductor device as a while. For example, it is made of a metal such as aluminum or copper, and its thickness is, for example, about 0.5 mm.

The cover plate 18 which has a single structure is disposed on the stiffener 16 and the semiconductor chip 12 so to be fixed to them through, for example, the thermosetting resin 17 or the resin 19 of the same property. The cover plate 18 is disposed for mechanical reinforcement and heat radiation of the semiconductor device. Its material can be, for example, aluminum or copper, and its thickness is, for example, about 1 mm or more. The stiffener 16, the cover plate 18, (and the resin 17) also function as a lid member for sealing the semiconductor chip 12 therein.

In addition, the chip member 20 having substantially the same main surface area as that of the semiconductor chip 12 is flip-chip connected to the opposite side of the resin substrate 11 from the flip-chip connected semiconductor chip 12. The flip-chip connection is made through the connection bumps 21. The chip member 20 is not particularly restricted as its electric characteristics but has a semiconductor substrate on which a large number of capacitor elements are formed. These capacitor elements can be functioned as, for example, a bypass capacitor, by conducting to a wiring pattern on the side of the resin substrate 11 through the connection bumps 21.

Besides, the solder balls 22 are mounted on the outer peripheral region of the region on the resin substrate 11 where the chip member 12 is positioned (namely, the BGA package). This mounting is made to the land (=external connection terminal) of the bottom wiring layer (not shown) of the resin substrate 11. Improvement of the connection reliability is intended by mounting on the mounting wiring board 30 through the solder balls 22.

It is general that the semiconductor device configured as described above has the resin substrate 11 and the semiconductor chip 12 connected firmly in order to secure reliability. Here, the material of the resin substrate 11 and the material of the semiconductor chip 12 have a largely different thermal expansion coefficient (e.g., different by about one digit). Therefore, in a case where the chip member 20 is not disposed, the resin substrate 11 is restricted its deformation in the vicinity of its center from one surface only but not restricted in the outer peripheral region. Therefore, the resin substrate 11 is deformed with complexity. In this embodiment, the chip member 20 is on the opposite side of the semiconductor chip 12 with the resin substrate 11 between them, the deformation of the resin substrate 11 is restricted from its both sides, and the restriction forces are substantially balanced. Therefore, the deformation caused in the resin substrate 11 is smaller. Thus, the stress occurred in the solder balls 22 connected to the mounting wiring board 30 is smaller, and the connection reliability is improved.

Figure 2:
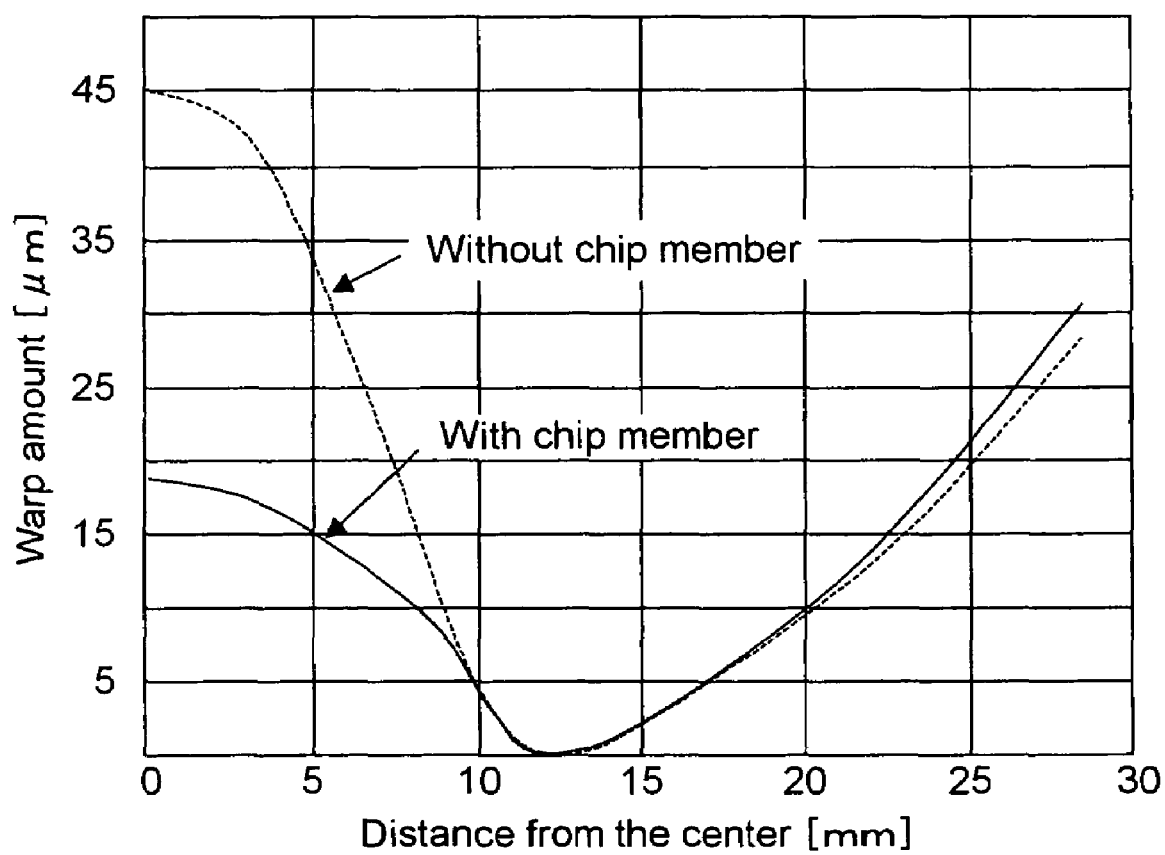
FIG. 2 is a graph showing a warp amount of the resin substrate used for the semiconductor device of the embodiment shown in FIG. 1A and FIG. 1B in comparison with that of the resin substrate before improvement.

FIG. 2 is a graph showing a warp amount of the resin substrate 11 used for the semiconductor device of the embodiment shown in FIG. 1A and FIG. 1B in comparison with that of one without improvement. The results were obtained by simulation, to determine the warp mounts caused in the resin substrate 11 using a distance from the center as a variable. As shown in FIG. 2, it was found that the warp amount was decreased largely at a portion close to the center by disposing the chip member 20 in comparison with the case that there is no chip member 20. It was also found by the same analysis that the maximum strain caused in the solder balls 22 under the conditions shown in FIG. 2 become $2.65 \times 10^{-2}$, when the chip member 20 is not disposed and $1.45 \times 10^{-2}$ (0.55 time) when the chip member 20 is disposed. Therefore, the connection reliability between the semiconductor device and the mounting wiring board 30 shown in FIG. 1A and FIG. 1B is improved in comparison with the art without improvement.

In the above description, the chip member 20 having the capacitor elements integrated on the semiconductor substrate is mentioned, but others can be used though inferior in view of ideal. For example, a ceramic substrate having capacitor elements thereon may be usable. Even the ceramic substrate can be expected to provide the same effect because the thermal expansion coefficient is generally very small in comparison with the organic material-based substrate. Besides, one not having the capacitor elements but having a mere dummy electrode has the same effect of reducing the warp amount of the resin substrate 11. Where the capacitor elements are incorporated, there is an advantage of functioning as a bypass capacitor which is often required originally as the semiconductor device. The same is also applied to the following embodiments.

Figure 3:
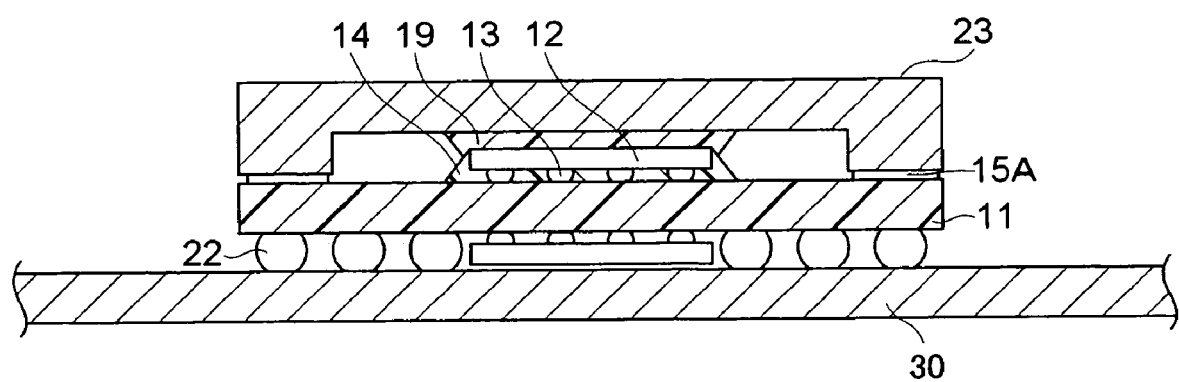
FIG. 3 is a sectional view schematically showing a structure of the semiconductor device according to another embodiment of the invention.

Then, the semiconductor device according to another embodiment of the invention will be described with reference to FIG. 3. FIG. 3 is a sectional view schematically showing a structure of the semiconductor device according to this embodiment of the invention. In FIG. 3, like component elements as those of FIG. 1A and FIG. 1B are denoted by like reference numerals, and detailed descriptions thereof will be omitted.

In this embodiment, a tray like lid 23 is disposed as a lid member instead of the stiffener 16, the resin 17, and the cover plate 18 shown in FIG. 1A and FIG. 1B. The lid 23 is fixed to an outer peripheral region through a resin 15A of a region, where the semiconductor chip 12 is positioned, on the resin substrate 11. The lid 23 has the same functions as those of the portions having the stiffener 16, the resin 17 and the cover plate 18 of FIG. 1A. The material of the lid 23 can be, for example, aluminum, copper or the like.

This embodiment also has the chip member 20 on the opposite side of the semiconductor chip 12 with the resin substrate 11 between them, so that the resin substrate 11 is restricted its deformation from both sides, and both restriction forces are substantially balanced. Therefore, the deformation caused in the resin substrate 11 becomes smaller. Thus, a stress generated in the solder balls 22 connected to the mounting wiring board 30 also becomes smaller, and the connection reliability is improved. In addition, the number of steps for assembling the semiconductor device is smaller than that shown in FIG. 1A and FIG. 1B, which is another advantage.

Figure 4A:
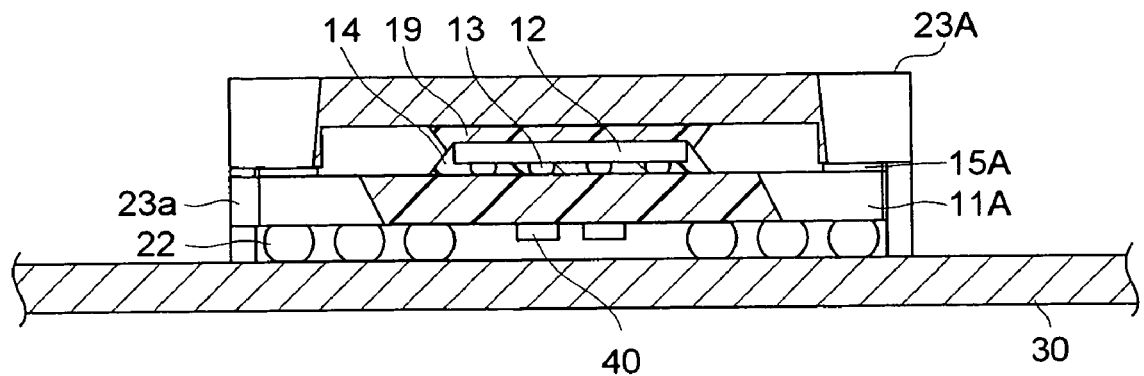
FIG. 4A and FIG. 4B are a sectional view schematically showing the structure of a semiconductor device according to still another embodiment of the invention and a bottom plan view of its resin substrate portion.
Figure 4B:
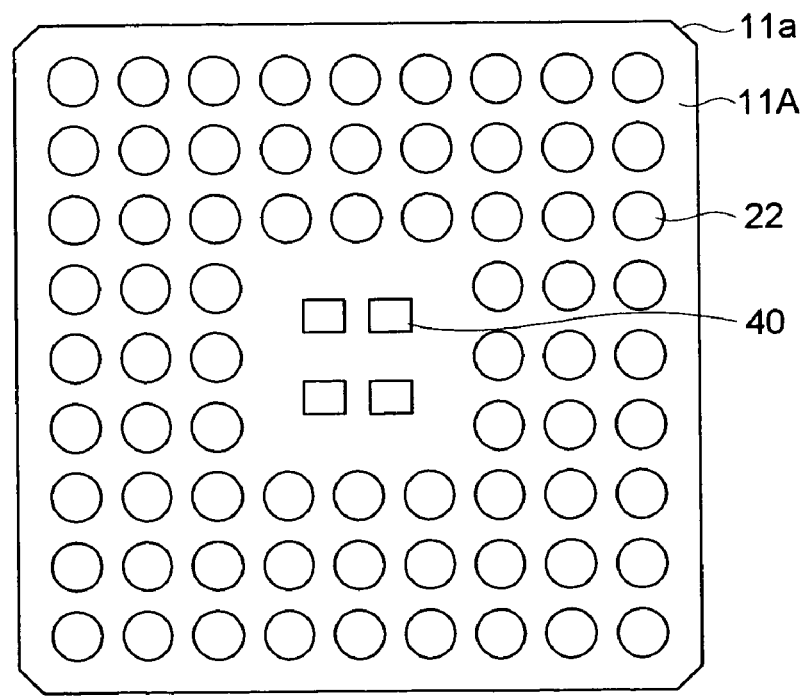

The semiconductor device according to still another embodiment of the invention will be described with reference to FIG. 4A and FIG. 4B. FIG. 4A and FIG. 4B are a sectional view schematically showing the structure of the semiconductor device according to this embodiment of the invention and a bottom plan view of its resin substrate portion. In FIG. 4A and FIG. 4B, like component elements as those of the previously described figures are denoted by like reference numerals, and detailed descriptions thereof will be omitted.

The semiconductor device of this embodiment improves the reliability of mounting on the mounting wiring board 30 from a viewpoint different from those of the above-described embodiments. As shown in FIG. 4A and FIG. 4B, the chip member 20 is eliminated in this embodiment, and, for example, chip capacitors 40 are mounted on the surface. A lid 23A has projections (substrate support members 23a) which reach the mounting wiring board 30 over the thickness of the resin substrate 11A in its thickness direction at portions (cutoff portions 11a) which are four cutoff corners of the resin substrate 11A. To fix the lid 23A to the resin substrate 11A, the same resin 15A as that shown in FIG. 3 is used.

Having the lid 23A including the substrate support members 23a, the solder balls 22 can be prevented from being deformed in the vertical direction by the weight of the semiconductor device at the time of mounting the semiconductor device on the mounting wiring board 30. If they are crushed in the vertical direction, the generation of stress in a shear direction increases per unit length, and the connection reliability is degraded. In this embodiment, stand-off can be secured by the substrate support members 23a when the semiconductor device is connected to the mounting wiring board 30. Thus, the deformation of the solder balls 22 in the vertical direction is decreased, and the reliability is improved. In this embodiment, the chip capacitors 40 are not particularly related to the improvement of the connection reliability, and its mounting region can be replaced by the connection portion provided by the solder balls 22.

Figure 5:
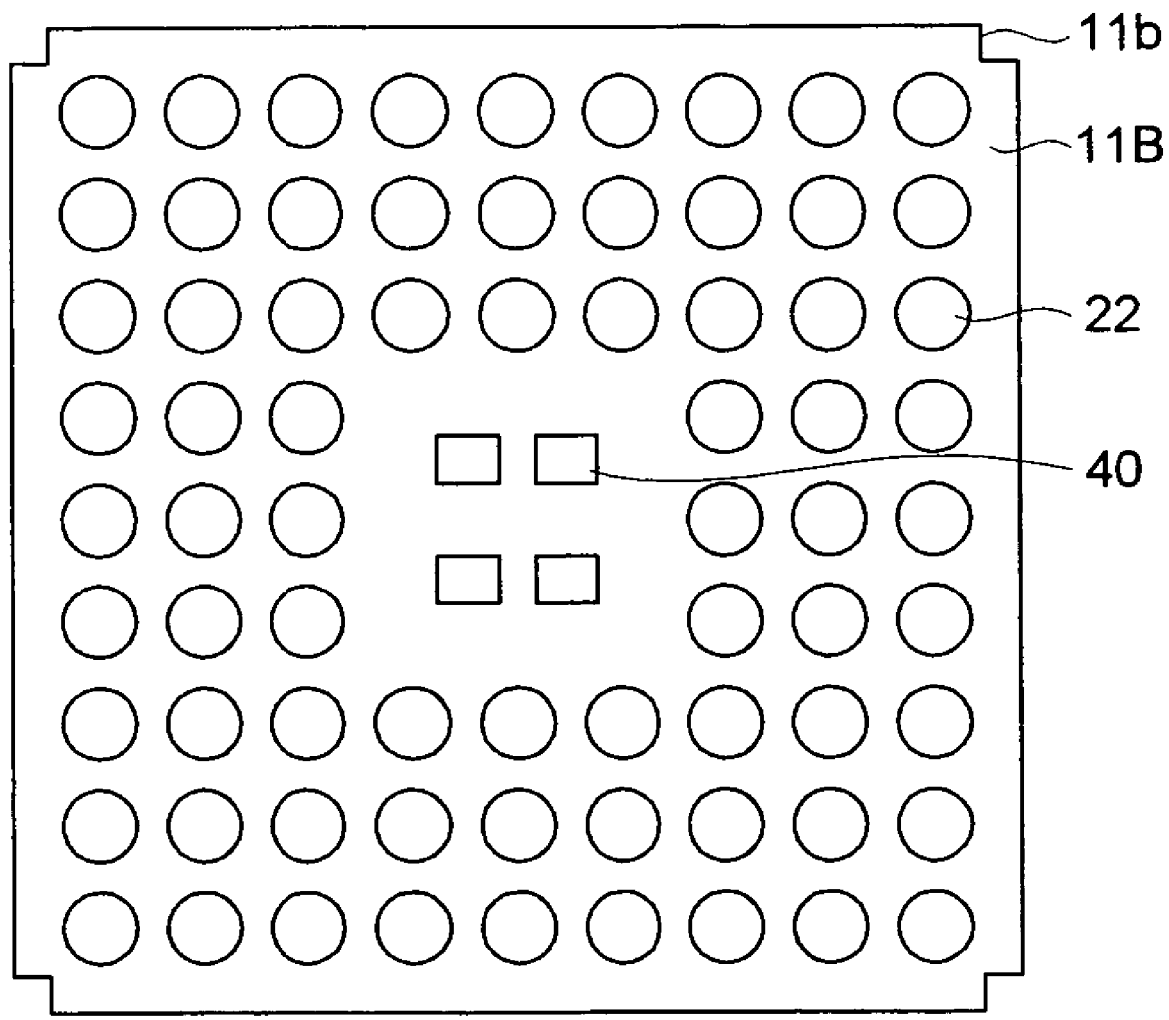
FIG. 5 is a bottom plan view schematically showing the structure of a resin substrate portion of the semiconductor device according to yet anther embodiment of the invention.

Then, the semiconductor device according to yet another embodiment of the invention will be described with reference to FIG. 5. FIG. 5 is a bottom plan view schematically showing the structure of the resin substrate portion of the semiconductor device according to this embodiment of the invention. In FIG. 5, like component elements as those of the previously described figures are denoted by like reference numerals, and detailed descriptions thereof will be omitted.

The semiconductor device of this embodiment has the same sectional view as that shown in FIG. 4A. Differences from the embodiment shown in FIG. 4A and FIG. 4B include that cutoff portions 11b at four corners of a resin substrate 11B have two sides instead of one side. The resin substrate 11B having this shape can obtain the same effects as those of the embodiment shown in FIG. 4A and FIG. 4B.

Figure 6A:
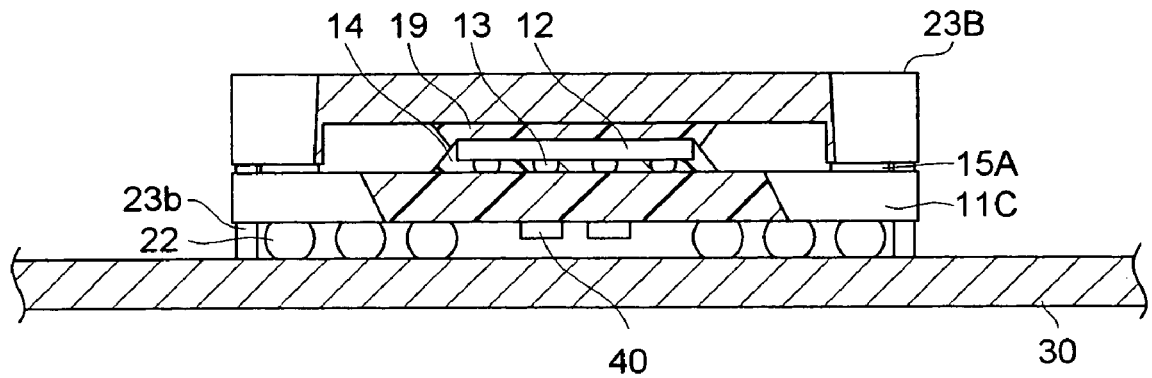
FIG. 6A and FIG. 6B are a sectional view schematically showing the structure of a semiconductor device according to yet another embodiment of the invention and a bottom plan view of its resin substrate portion.
Figure 6B:
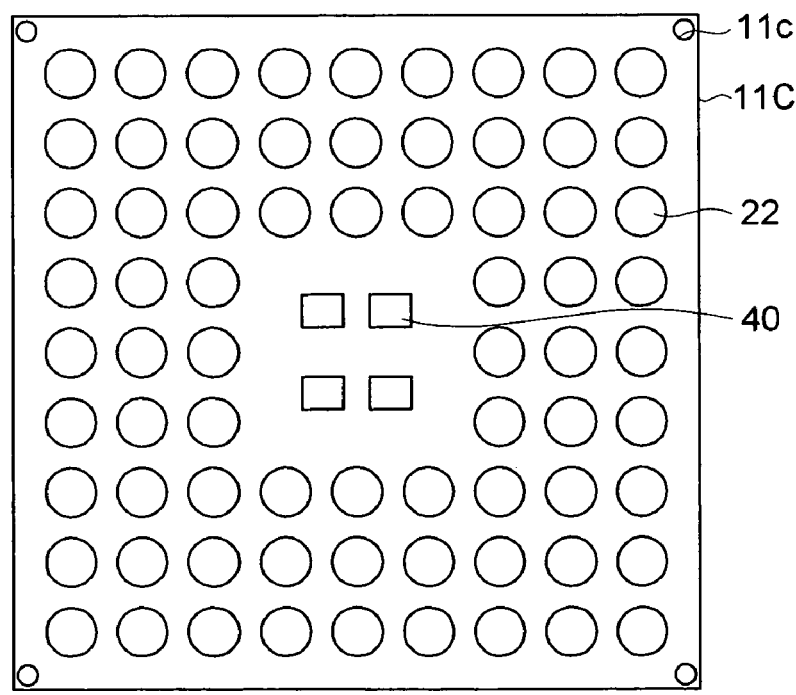

Then, the semiconductor device according to yet another embodiment of the invention will be described with reference to FIG. 6A and FIG. 6B. FIG. 6A and FIG. 6B are a sectional view schematically showing the structure of the semiconductor device according to this embodiment of the invention and a bottom plan view of its resin substrate portion. In FIG. 6A and FIG. 6B, like component elements as those of the previously described figures are denoted by like reference numerals, and detailed descriptions thereof will be omitted.

The semiconductor device of this embodiment does not have cutoff portions but have through holes 11c at four corners of a resin substrate 11C. Accordingly, a lid 23B having substrate support members 23b which can be inserted through the through holes 11c is disposed as a lid member. The resin substrate 11C having this shape can obtain the same effects as those of the embodiments shown in FIG. 4A, FIG. 4B and FIG. 5.

In the embodiments shown in FIG. 4A through FIG. 6B, the resin substrates 11A, 11B, 11C have the cutoff portions 11a, 11b, or the through holes 11c, so that the substrate support members 23a, 23b do not protrude from the four original sides of the resin substrates 11A, 11B, 11C when seen on the plan views. Therefore, these embodiments are especially useful for applications requiring good mounting area efficiency. If the area efficiency does not become a problem, the lid member may be provided with the substrate support members to protrude from the resin substrate 11 not having the cutoff portions 11a, 11b or the through holes 11c.

Figure 7A:
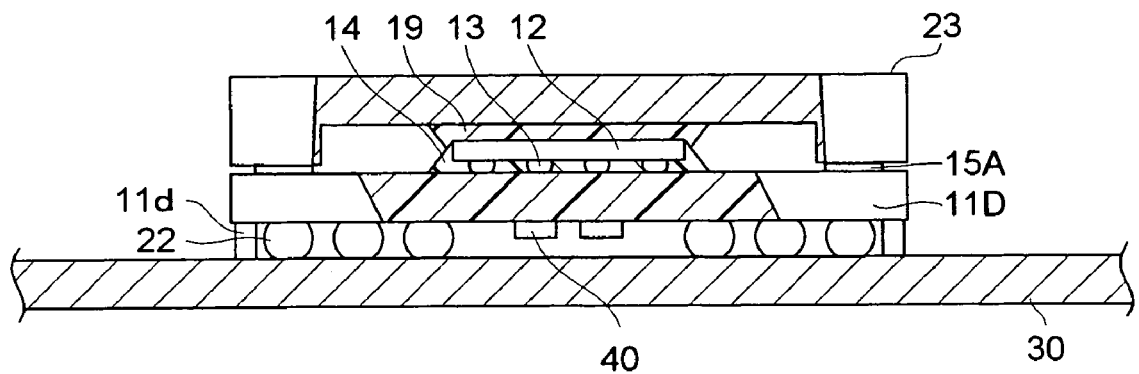
FIG. 7A and FIG. 7B are a sectional view schematically showing the structure of a semiconductor device according to yet another embodiment of the invention and a bottom plan view of its resin substrate portion.
Figure 7B:
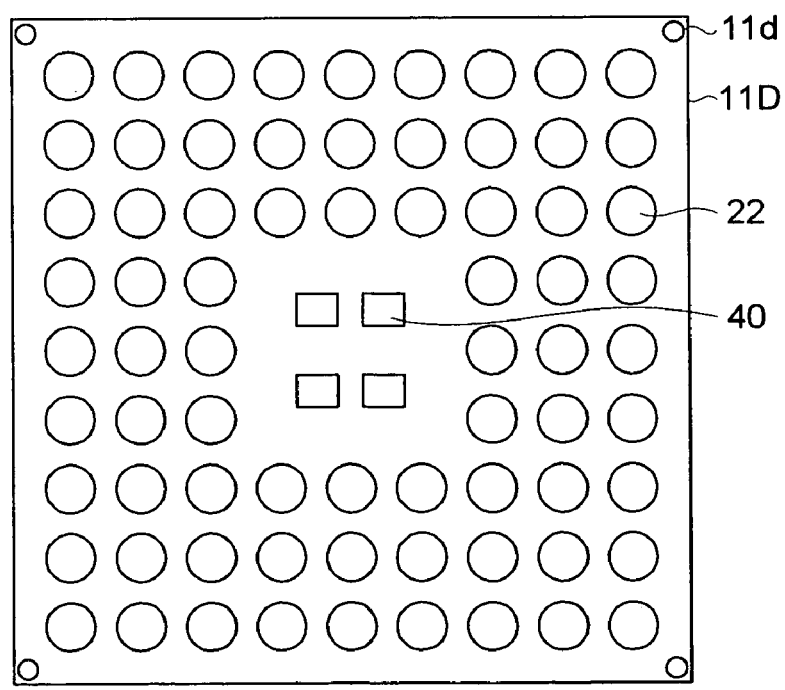

Then, the semiconductor device according to yet another embodiment of the invention will be described with reference to FIG. 7A and FIG. 7B. FIG. 7A and FIG. 7B are a sectional view schematically showing the structure of the semiconductor device according to this embodiment of the invention and a bottom plan view of its resin substrate portion. In FIG. 7A and FIG. 7B, like component elements as those of the previously described figures are denoted by like reference numerals, and detailed descriptions thereof will be omitted.

The semiconductor device of this embodiment does not have substrate support members 11d disposed on the lid member 23 but disposed to directly protrude from the surface of a resin substrate 11D where the solder balls 22 are present. Even by the resin substrate 11D having the substrate support members 11d, the solder balls 22 can be prevented from being deformed so to be crushed in the vertical direction because of the weight of the semiconductor device when the semiconductor device is mounted on the mounting wiring board 30. In other words, a stand-off can be secured by the substrate support member 11d when the semiconductor device is connected to the mounting wiring board 30. Thus, deformation of the solder balls 22 in the vertical direction is decreased, and the reliability is improved.

Figure 8A:
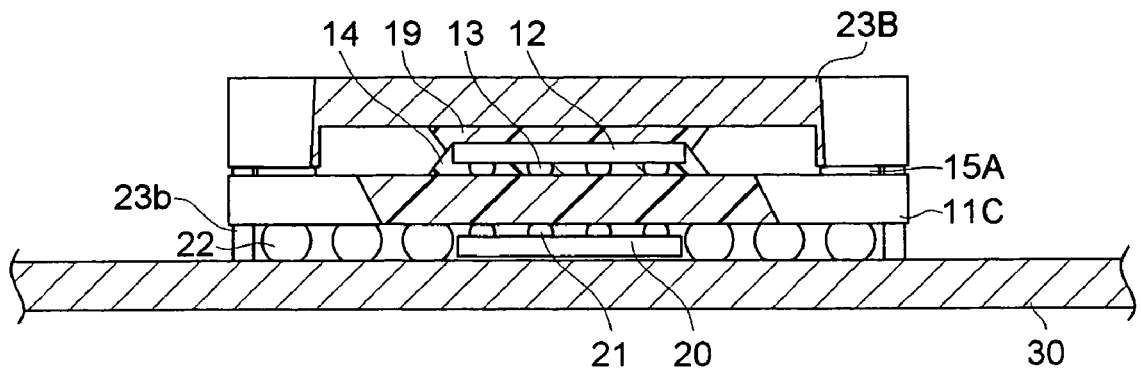
FIG. 8A and FIG. 8B are a sectional view schematically showing the structure of a semiconductor device according to yet another embodiment of the invention and a bottom plan view of its resin substrate portion.
Figure 8B:
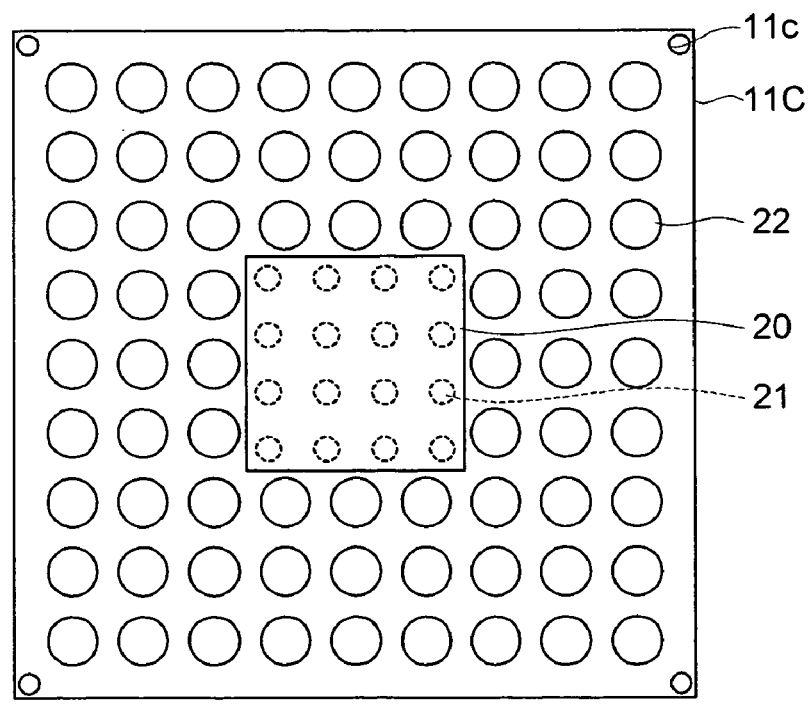

Then, the semiconductor device according to yet another embodiment of the invention will be described with reference to FIG. 8A and FIG. 8B. FIG. 8A and FIG. 8B are a sectional view schematically showing the structure of the semiconductor device according to this embodiment of the invention and a bottom plan view of its resin substrate portion. In FIG. 8A and FIG. 8B, like component elements as those of the previously described figures are denoted by like reference numerals, and detailed descriptions thereof will be omitted.

This embodiment is an aspect adopting both the improvement of the reliability by disposing the chip member 20 shown in FIG. 3 and the improvement of the reliability by disposing the substrate support members 23b as shown in FIG. 6A and FIG. 6B. In this case, it is also possible to adopt the aspect shown in FIG. 4A and FIG. 4B, FIG. 5, or FIG. 7A and FIG. 7B instead of the aspect shown in FIG. 6A and FIG.

6B. In addition, if the mounting area efficiency does not become a problem, the substrate support members may be disposed on the lid member to protrude from the resin substrate 11 which is free from the cutoff portions 11a and 11b or the through holes 11c.

Figure 9:
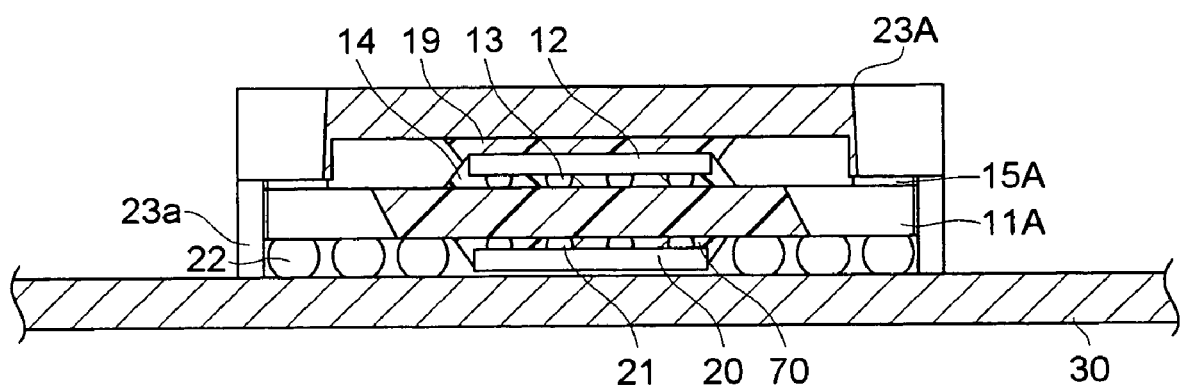
FIG. 9 is a sectional view schematically showing the structure of a semiconductor device according to yet another embodiment of the invention.

Then, the semiconductor device according to yet another embodiment of the invention will be described with reference to FIG. 9. FIG. 9 is a sectional view schematically showing the structure of the semiconductor device according to this embodiment of the invention. In FIG. 9, like component elements as those of the previously described figures are denoted by like reference numerals, and detailed descriptions thereof will be omitted.

This embodiment has, for example, a thermosetting underfill resin 70 disposed to fill the space between the chip member 20 and the resin substrate 11A. By disposing the underfill resin 70, the aspect of mounting the semiconductor chip 12 on the opposite side of the resin substrate 11A from the chip member 20 and the aspect of mounting the chip member 20 have the same structure. Thus, actions and the like for restricting the deformation of the resin substrate 11A are well balanced, so that the deformation generated in the resin substrate 11A can be further decreased. Therefore, the reliability of connection to the mounting wiring board 30 can be improved furthermore. The improvement of the reliability by the underfill resin 70 can also be applied to the embodiments shown in FIG. 1A and FIG. 1B, FIG. 3, or FIG. 8A and FIG. 8B.

It is to be understood that the present invention is not limited to the specific embodiments thereof illustrated herein, and various modifications may be made without deviating from the spirit and scope of the invention as set forth in the following claims.

What is claimed is:

1. A semiconductor device, comprising:
   an organic material-based substrate;
   a semiconductor chip, flip-chip connected to substantially a center of one surface side of the organic material-based substrate;
   a resin disposed to fill a space between the flip-chip connected semiconductor chip and the organic material-based substrate;
   a lid member having a first portion fixed to an outer peripheral region of a region the semiconductor chip is positioned at of the organic material-based substrate and having a second portion fixed to the semiconductor chip in a side opposite to a flip-chip connected side of the flip-chip connected semiconductor chip; and
   a support member fixed to a vicinity of the first portion of the lid member, extending from the vicinity of the first portion of the lid member to a side beyond the organic material-based substrate in a thickness direction of the organic material-based substrate.

2. The semiconductor device as set forth in claim 1, further comprising a chip member disposed on another surface side of the organic material-based substrate, the other surface side being opposite to the one surface side of the organic material-based substrate on which the semiconductor chip is flip-chip connected, the chip member having a substantially same main surface area as the semiconductor chip.

3. The semiconductor device as set forth in claim 2, further comprising a second resin disposed to fill a space between the chip member and the organic material-based substrate.

4. The semiconductor device as set forth in claim 2, further comprising an external connection terminal disposed in an outer peripheral region of a region the chip member is positioned at, on the other surface side of the organic material-based substrate where the chip member is disposed, wherein the external connection terminal is accompanied with solder balls.

5. The semiconductor device as set forth in claim 2, wherein the chip member has a semiconductor substrate and plural capacitor elements mounted on the semiconductor substrate, and
   wherein the plural capacitor elements are electrically connected to the organic material-based substrate.

6. The semiconductor device as set forth in claim 1, wherein the organic material-based substrate has a shape with a cutoff portion for relief from the support member.

7. The semiconductor device as set forth in claim 1, wherein the organic material-based substrate has a shape with a through hole for relief from the support member.

* * * * *